(12) United States Patent
Ferrasse et al.

(10) Patent No.: US 11,035,036 B2
(45) Date of Patent: Jun. 15, 2021

(54) METHOD OF FORMING COPPER ALLOY SPUTTERING TARGETS WITH REFINED SHAPE AND MICROSTRUCTURE

(71) Applicant: Honeywell International Inc., Morris Plains, NJ (US)

(72) Inventors: Stephane Ferrasse, Spokane, WA (US); Frank C. Alford, Spokane Valley, WA (US); Ira G. Nolander, Spokane, WA (US); Erik L. Turner, Spokane, WA (US); Patrick Underwood, Spokane, WA (US)

(73) Assignee: Honeywell International Inc., Charlotte, NC (US)

( * ) Notice: Subject to any disclaimer, the term of this patent is extended or adjusted under 35 U.S.C. 154(b) by 207 days.

(21) Appl. No.: 16/247,232

(22) Filed: Jan. 14, 2019

(65) Prior Publication Data

US 2019/0233935 A1    Aug. 1, 2019

Related U.S. Application Data

(60) Provisional application No. 62/625,122, filed on Feb. 1, 2018.

(51) Int. Cl.
  *C23C 14/34* (2006.01)
  *C22C 9/05* (2006.01)
  *C22F 1/08* (2006.01)
  *B21J 1/00* (2006.01)

(52) U.S. Cl.
  CPC ............ *C23C 14/3414* (2013.01); *B21J 1/00* (2013.01); *C22C 9/05* (2013.01); *C22F 1/08* (2013.01)

(58) Field of Classification Search
  CPC .................................................. C23C 14/3414
  USPC .......................................................... 148/681
  See application file for complete search history.

(56) References Cited

U.S. PATENT DOCUMENTS

| | | | |
|---|---|---|---|
| 5,709,957 | A | 1/1998 | Chiang et al. |
| 5,906,717 | A | 5/1999 | Hasegawa et al. |
| 6,165,607 | A | 12/2000 | Yamanobe et al. |
| 6,329,275 | B1 | 12/2001 | Ishigami et al. |

(Continued)

FOREIGN PATENT DOCUMENTS

| | | |
|---|---|---|
| CN | 102517621 B | 6/2012 |
| CN | 104746020 B | 7/2015 |

(Continued)

OTHER PUBLICATIONS

International Search Report and Written Opinion received for PCT Patent Application No. PCT/US2019/016044, dated May 16, 2019, 8 pages.

(Continued)

*Primary Examiner* — Coris Fung
*Assistant Examiner* — Danielle Carda
(74) *Attorney, Agent, or Firm* — Faegre Drinker Biddle & Reath LLP

(57) ABSTRACT

A method of forming a copper manganese sputtering target including subjecting a copper manganese billet to a first unidirectional forging step, heating the copper manganese billet to a temperature from about 650° C. to about 750° C., subjecting the copper manganese billet to a second unidirectional forging step, and heating the copper manganese billet to a temperature from about 500° C. to about 650° C. to form a copper alloy.

19 Claims, 13 Drawing Sheets

(56) References Cited

U.S. PATENT DOCUMENTS

| | | |
|---|---|---|
| 6,569,270 B2 | 5/2003 | Segal |
| 6,736,947 B1 | 5/2004 | Watanabe et al. |
| 7,256,980 B2 | 8/2007 | Borland |
| 7,260,053 B2 | 8/2007 | Harigaya et al. |
| 7,384,678 B2 | 6/2008 | Miura et al. |
| 7,413,977 B2 | 8/2008 | Shimizu et al. |
| 7,452,812 B2 | 11/2008 | Beyer et al. |
| 7,507,304 B2 | 3/2009 | Okabe et al. |
| 7,507,659 B2 | 3/2009 | Ohtsuka et al. |
| 7,611,984 B2 | 11/2009 | Koura et al. |
| 7,622,809 B2 | 11/2009 | Gotoh et al. |
| 7,626,665 B2 | 12/2009 | Koike |
| 7,719,626 B2 | 5/2010 | Takahashi et al. |
| 7,740,721 B2 | 6/2010 | Okabe |
| 7,767,043 B2 | 8/2010 | Segal et al. |
| 7,932,176 B2 | 4/2011 | Gordon et al. |
| 7,994,055 B2 | 8/2011 | Sakai et al. |
| 8,003,518 B2 | 8/2011 | Haneda et al. |
| 8,039,390 B2 | 10/2011 | Nakao et al. |
| 8,071,474 B2 | 12/2011 | Shimizu et al. |
| 8,110,504 B2 | 2/2012 | Nakao et al. |
| 8,119,462 B2 | 2/2012 | Takasawa et al. |
| 8,143,093 B2 | 3/2012 | Ye |
| 8,168,532 B2 | 5/2012 | Haneda et al. |
| 8,188,599 B2 | 5/2012 | Koike |
| 8,198,730 B2 | 6/2012 | Tagami et al. |
| 8,227,347 B2 | 7/2012 | Tatsumi |
| 8,242,015 B2 | 8/2012 | Matsumoto et al. |
| 8,247,321 B2 | 8/2012 | Matsumoto et al. |
| 8,258,626 B2 | 9/2012 | Koike et al. |
| 8,268,433 B2 | 9/2012 | Tsuchino et al. |
| 8,304,909 B2 | 11/2012 | Lavoie |
| 8,324,738 B2 | 12/2012 | Liu et al. |
| 8,410,581 B2 | 4/2013 | Tatsumi et al. |
| 8,500,928 B2 | 8/2013 | Matera et al. |
| RE44,817 E | 3/2014 | Koike |
| 9,028,658 B2 | 5/2015 | Aoki et al. |
| 9,050,647 B2 | 6/2015 | Thomas et al. |
| 9,090,970 B2 | 7/2015 | Nagata et al. |
| 9,097,515 B2 | 8/2015 | Lim et al. |
| 9,165,750 B2 | 10/2015 | Nagata et al. |
| 9,704,695 B2 | 7/2017 | Nagata et al. |
| 2004/0072009 A1* | 4/2004 | Segal ............... B21C 23/01 428/561 |
| 2004/0104110 A1 | 6/2004 | Lee |
| 2005/0040030 A1 | 2/2005 | McDonald |
| 2005/0252584 A1 | 11/2005 | Watanabe et al. |
| 2005/0279630 A1 | 12/2005 | Fonte |
| 2006/0071338 A1 | 4/2006 | Petrarca et al. |
| 2006/0189132 A1 | 8/2006 | Iwabuchi et al. |
| 2006/0249372 A1 | 11/2006 | Xiang et al. |
| 2007/0137831 A1 | 6/2007 | Torng et al. |
| 2008/0105926 A1 | 5/2008 | Lai et al. |
| 2008/0121516 A1 | 5/2008 | Sarkar et al. |
| 2008/0131735 A1 | 6/2008 | Das et al. |
| 2008/0156636 A1 | 7/2008 | Petrarca et al. |
| 2008/0230375 A1 | 9/2008 | Maekawa et al. |
| 2008/0305573 A1 | 12/2008 | Sterzel |
| 2009/0020192 A1 | 1/2009 | Segal et al. |
| 2009/0022982 A1 | 1/2009 | Ivanov et al. |
| 2009/0065354 A1 | 3/2009 | Kardokus et al. |
| 2009/0117731 A1 | 5/2009 | Yu et al. |
| 2009/0184322 A1 | 7/2009 | Takasawa et al. |
| 2009/0242385 A1 | 10/2009 | Robison et al. |
| 2009/0321934 A1 | 12/2009 | Lavoie et al. |
| 2009/0321935 A1 | 12/2009 | O'Brien et al. |
| 2010/0007023 A1 | 1/2010 | Koura et al. |
| 2010/0013096 A1 | 1/2010 | Irumata et al. |
| 2010/0099254 A1 | 4/2010 | Narushima et al. |
| 2010/0233876 A1 | 9/2010 | Matsumoto et al. |
| 2011/0266676 A1 | 11/2011 | Isobayashi |
| 2011/0281134 A1 | 11/2011 | Maki et al. |
| 2011/0281136 A1 | 11/2011 | Duh et al. |
| 2012/0012465 A1 | 1/2012 | Kim et al. |
| 2012/0025380 A1 | 2/2012 | Neishi et al. |
| 2012/0068265 A1 | 3/2012 | Maki et al. |
| 2012/0132523 A1 | 5/2012 | Hagihara et al. |
| 2013/0001069 A1 | 1/2013 | Nakashima et al. |
| 2013/0069234 A1 | 3/2013 | Lee et al. |
| 2013/0126345 A1 | 5/2013 | Tatsumi et al. |
| 2013/0285245 A1 | 10/2013 | Cabral, Jr. et al. |
| 2014/0158532 A1 | 6/2014 | Nagata et al. |
| 2016/0130685 A1 | 5/2016 | Huang et al. |
| 2019/0112702 A1 | 4/2019 | Ferrasse et al. |

FOREIGN PATENT DOCUMENTS

| | | |
|---|---|---|
| CN | 104937133 A | 9/2015 |
| CN | 105525149 A | 4/2016 |
| CN | 105525262 A | 4/2016 |
| CN | 106282938 A | 1/2017 |
| CN | 106399954 A | 2/2017 |
| CN | 106435261 A | 2/2017 |
| EP | 0352748 B1 | 1/1990 |
| EP | 0881311 A1 | 12/1998 |
| EP | 1695839 A1 | 8/2006 |
| JP | 2000348383 A | 12/2000 |
| JP | 4718664 B2 | 12/2001 |
| JP | 4900992 B2 | 2/2002 |
| JP | 4900993 B2 | 3/2002 |
| JP | 2002141201 A | 5/2002 |
| JP | 4936613 B2 | 3/2003 |
| JP | 4305809 B2 | 2/2004 |
| JP | 2004076080 A | 3/2004 |
| JP | 3994386 B2 | 7/2004 |
| JP | 4237479 B2 | 7/2004 |
| JP | 4534417 B2 | 7/2004 |
| JP | 4379602 B2 | 4/2005 |
| JP | 4351036 B2 | 6/2005 |
| JP | 2005313230 A | 11/2005 |
| JP | 2006005104 A | 1/2006 |
| JP | 5068925 B2 | 3/2006 |
| JP | 2006073863 A | 3/2006 |
| JP | 4953615 B2 | 6/2006 |
| JP | 2008306043 A | 12/2008 |
| JP | 2009266985 A | 11/2009 |
| JP | 5277808 B2 | 3/2010 |
| JP | 2011029255 A | 2/2011 |
| JP | 2011214039 A | 10/2011 |
| JP | 2011256457 A | 12/2011 |
| JP | 2012149294 A | 8/2012 |
| JP | 2012149346 A | 8/2012 |
| JP | 2012156545 A | 8/2012 |
| JP | 2013067857 A | 4/2013 |
| JP | 5032706 B2 | 9/2013 |
| KR | 1070185 B1 | 10/2011 |
| KR | 2012001121 A | 1/2012 |
| KR | 10-2013-0122968 A | 11/2013 |
| KR | 2015039219 A | 4/2015 |
| KR | 2015-0119284 A | 10/2015 |
| KR | 2015119284 A | 10/2015 |
| KR | 2017058459 A | 5/2017 |
| WO | 9961679 A1 | 12/1999 |
| WO | 2014102747 A2 | 1/2014 |
| WO | 2015/099119 A1 | 7/2015 |
| WO | 2017014990 A1 | 1/2017 |

OTHER PUBLICATIONS

International Search Report and Written Opinion issued in PCT/US2018/055418, dated Jan. 31, 2019, 13 pages.

Jozef, Z.; et al. (2010). Ultrafine grained structure development in steel with different initial structure by severe plastic deformation. Revista Materia, 15(2):240-246.

Song, Y. B.; et al. (2006). Recrystallization behavior of 7175 Al alloy during modified strain-induced melt-activated (SIMA) process. Materials Transactions, 47(4)1250-1256.

Wang, P.; et al. (2015). A two-step superplastic forging forming of semi-continuously cast AZ70 magnesium alloy. Journal of Magnesium and Alloys 3:70-75.

* cited by examiner

Forge + heat treat at 550 °C, 1.5h

Forge + heat treat at 650 °C, 1.5h

Forge + heat treat at 800 °C, 1.5h

As-received billet

Second heat treat at 550 °C, 2h

Second heat treat at 600 °C, 2h

As-received billet

Second heat treat at 550 °C, 2h

Second heat treat at 600 °C, 2h

Second heat treat at 550 °C, 2h

Second heat treat at 600 °C, 2h

Second heat treat at 650 °C, 2h

METHOD OF FORMING COPPER ALLOY SPUTTERING TARGETS WITH REFINED SHAPE AND MICROSTRUCTURE

CROSS-REFERENCE TO RELATED APPLICATION

This application claims priority to Provisional Application No. 62/625,122 filed Feb. 1, 2018, which is herein incorporated by reference in its entirety.

TECHNICAL FIELD

The present disclosure generally relates to copper manganese alloys and methods of forming copper manganese alloys. More specifically, the present disclosure relates to copper manganese alloys with refined shape and microstructures. In some embodiments, the copper manganese alloys may be formed into sputtering targets and used in various sputtering applications.

BACKGROUND

Physical vapor deposition ("PVD") methodologies are used extensively for forming thin films of material over a variety of substrates. In one PVD process, known as sputtering, atoms are ejected from the surface of a sputtering target by bombardment with gas ions, such as plasma. Thus, the sputtering target is the source of material which is deposited onto a substrate.

A schematic diagram of a portion of an exemplary sputtering assembly is shown in FIG. 1. A sputtering assembly 10 comprises a backing plate 12 having a sputtering target 14 bonded thereto. A semiconductor wafer 18 is positioned within the assembly and is spaced from a sputtering surface 16 of the sputtering target 14. In operation, particles or sputtered material 22 is displaced from the surface 16 of the sputtering target 14 and deposits on the surface of the semiconductor wafer 18 to form a coating (or thin film) 20 on the wafer. It is to be understood that the sputtering assembly 10 depicted in FIG. 1 is an example configuration since, for example, both the target 14 and the backing plate 12 can be any suitable size or shape. In some embodiments, the physical vapor deposition apparatus 10 may include the sputtering target 14 without the backing plate 12. This configuration is referred to as a monolithic configuration.

Various metals and alloys can be deposited using PVD technology, including for example Al, Ti, Cu, Ta, Ni, Mo, Au, Ag, Pt, and alloys of these elements. One such alloy is copper manganese ("CuMn") which has been used in sputtering targets to form, for example, various metal interconnects used in the semiconductor industry.

A sputtering target may be formed or forged from a metal or metal alloy billet. The use of various casting techniques that are characterized by a slower cooling rate can be advantageous to reduce the overall impurity of the billets and obtain cast billets, and thus sputtering targets, with higher purity. However, slower cooling during casting can result in large microstructures that can be detrimental during further processing. Therefore, there is a desire in the industry for increasingly refined metal and metal alloys and methods for forming such refined metal and metal alloys, for example as billets.

SUMMARY

Various aspects of the present disclosure relate to a method of forming a copper manganese sputtering target. The method includes subjecting a copper manganese billet to a first unidirectional forcing step such that a number of grains of the copper manganese billet are increased by at least a factor of 10. The method also includes heating the copper manganese billet at a temperature from about 650° C. to about 750° C. for from about 1 hour to about 3 hours in a first heat treatment step. The method also includes subjecting the copper manganese billet to a second unidirectional forging step such that the height of the billet is reduced by from about 40 percent to 95 percent. The method also includes heating the copper manganese billet at a temperature from about 500° C. to about 650° C. for from about 4 hours to about 8 hours in a second heat treatment step to form a copper alloy.

Various aspects of the present disclosure relate to a method of forming a copper alloy sputtering target. The method includes subjecting a copper alloy billet to a first forging step such that a number of grains of the copper alloy billet are increased by at least a factor of 10. The method also includes heating the copper alloy billet after the first forging step in a first heat treatment step at a temperature and for a time sufficient to achieve 100 percent recrystallization of the copper alloy. The method also includes subjecting the copper alloy billet to a second forging step such that a height of the copper alloy billet is reduced by from about 40 percent to 95 percent. The method also includes heating the copper alloy billet after the second forging step in a second heat treatment step at a temperature and for a time sufficient to achieve a substantially refined grain structure. The method also includes forming the copper alloy billet into a copper alloy sputtering target.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

DETAILED DESCRIPTION

Disclosed herein is a copper manganese alloy for use, for example, in a sputtering target. Also disclosed herein are methods of forming copper manganese alloys. More specifically, disclosed herein are methods of forming copper manganese alloys with refined shape and refined, uniform microstructure.

It has been found that copper manganese alloys may form large grain and/or non-uniform grain structures when subjected to certain processing techniques such as, for example, various casting techniques used in combination with slow cooling. As used herein, slow cooling refers to controlled or natural cooling of a cast copper manganese material from its melting temperature to an ambient temperature. During slow cooling, the cast material remains in the same crucible as used during the heating and melting phases and is allowed to cool within the crucible. This technique is opposed to other, faster cooling techniques such as quenching or pouring of the molten material from a first crucible to a second crucible with a significantly lower temperature than that of the molten material. Subjecting the copper manganese material to slow cooling may contribute to misshapen billets, increased cracking in billets, and various other defects during further plastic deformation, for example as the billet is processed to form a sputtering target. This slow cooling may reduce the overall impurity of the billets, enabling cast billets with higher purities to be obtained. However, slow cooling can result in large microstructures that can be detrimental during further processing. The alloys and methods disclosed herein produce copper manganese alloys having improved shape, reduced cracking and/or reduced defects during further plastic deformation.

The copper manganese alloy includes copper as a primary component and manganese as a secondary component. Copper, as the primary component, is present in a higher weight percentage than manganese, which is a secondary component. For example, the copper manganese alloy can include greater than 90 wt. %, greater than 98 wt. %, or greater than 99 wt. % copper, and less than 10 wt. %, less than 2.0 wt. %, less than 1.0 wt. % manganese, less than 0.1 wt. % manganese or less than 0.01 wt. % manganese. In some embodiments the copper manganese alloy may include copper, manganese and one or more additional secondary components. In other embodiments, the copper manganese alloy may consist of copper, manganese and inevitable impurities, such as oxygen, carbon and other trace elements.

Figure 1:
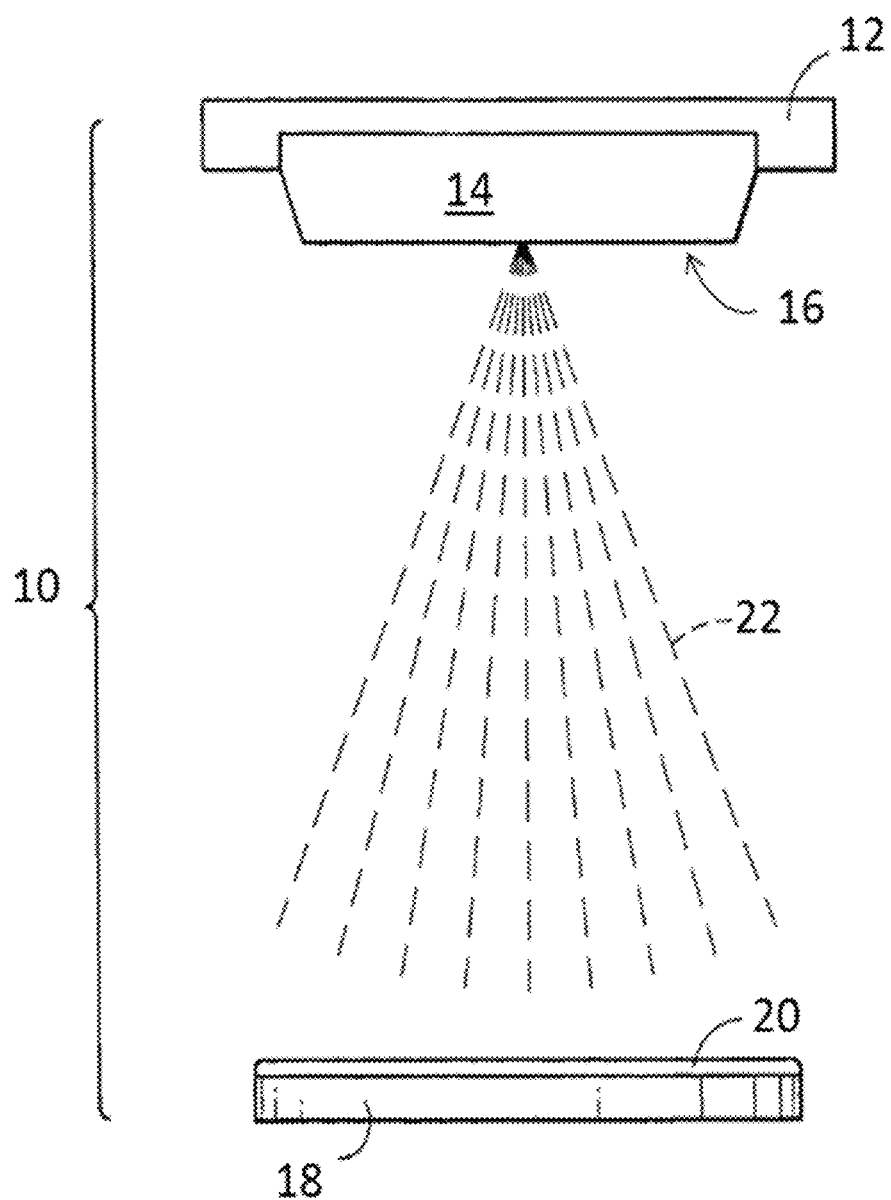
FIG. 1 is a schematic diagram of a portion of an exemplary sputtering assembly, according to some embodiments.
Figure 2:
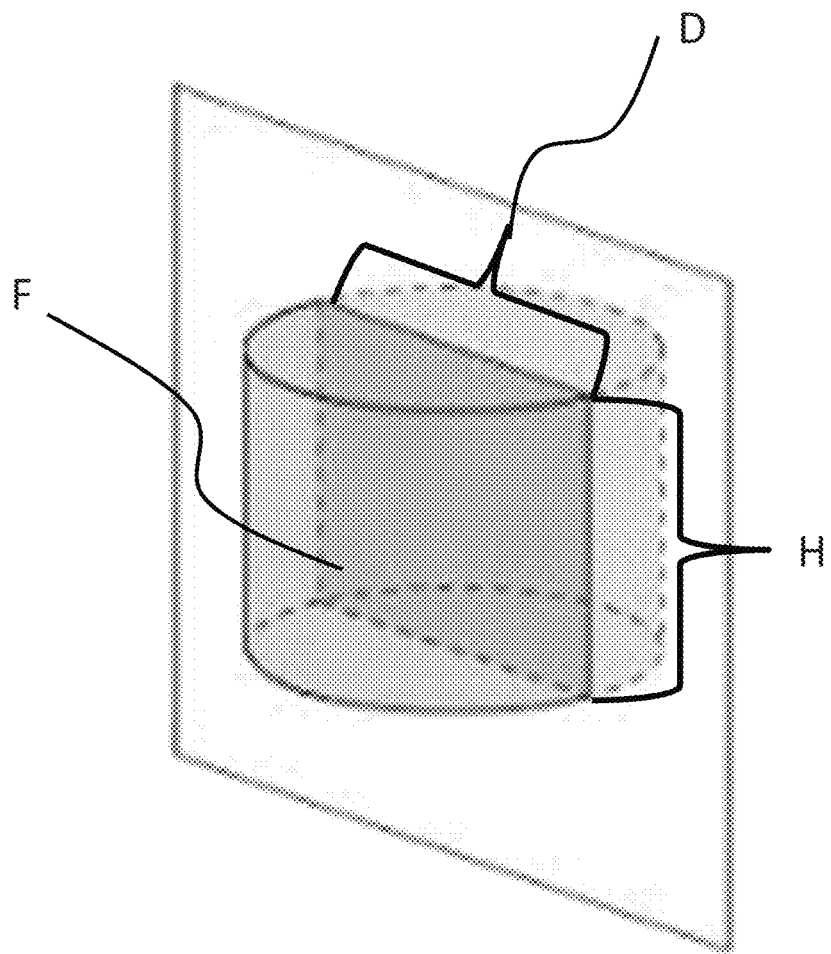
FIG. 2 is a perspective diagram of an exemplary billet.

In some embodiments, the copper manganese alloy may have a refined microstructure. In various examples, the amount of refinement of the microstructure can be characterized by a ratio, R, of the cross-sectional area of a billet over the average area of grains in that given cross-section. In other terms, R can be defined as the total number of grains per billet cross-section. With reference to FIG. 2, the cross-sectional area of the billet is the area of a face F of the billet when the billet is cut in half at diameter D along its height H (i.e., the cross-sectional area taken perpendicular to the bases of a cylindrical billet). In some embodiments, the microstructure of the copper manganese alloy is characterized such that it has a ratio R greater than or equal to about 500. The copper manganese alloy may have a ratio R greater than 500, which, for example, is equivalent to greater than 500 grains per billet cross-section. In one example, a cylindrical billet with a height of 10 inches and a diameter of 10 inches has a cross-sectional area of 100 in$^2$ or 64,500 mm$^2$. If the average diameter of grains in that billet is about 12.82 mm or 0.5 in, the average area of grains would be about 130 mm$^2$ or 0.2 in$^2$. Therefore, the ratio R would be about 500 (i.e., there would be about 500 grains in the given cross-sectional area). In other examples, the copper manganese alloy may have a ratio R greater than 1,000, greater than 10,000, greater than 100,000, greater than 1,000,000, or greater than 10,000,000. Generally, the billet has a certain, minimum number of grains required for a given billet size to facilitate isotropic and uniform deformation in all directions during forging. In some embodiments, the copper manganese alloy may have an average grain size that is less than about 150 μm in diameter, less than about 100 μm in diameter, less than about 80 μm in diameter, less than about 50 μm in diameter, less than about 25 μm in diameter, or less than about 1 μm in diameter. Generally, the average grain size of a given billet will vary depending on the size and/or the cross-sectional area of the billet.

In some embodiments, the copper manganese alloy billet can have a refined shape. The billet may have a top face and/or a bottom face that is substantially equiaxed, circular, or rounded in shape. For example, the top face and/or the bottom face of the billet may have approximately equal dimensions in all directions. In other terms, the diameter of the top face and/or the bottom face in one direction is approximately equal to the diameter of the top face and/or the bottom face in the opposite/perpendicular direction. In some embodiments, the top face and bottom face of the billet are uniform and/or smooth in texture. The billet may also be formed such that there may be no substantial protrusions detectable at the edges of the billet.

Figure 3:
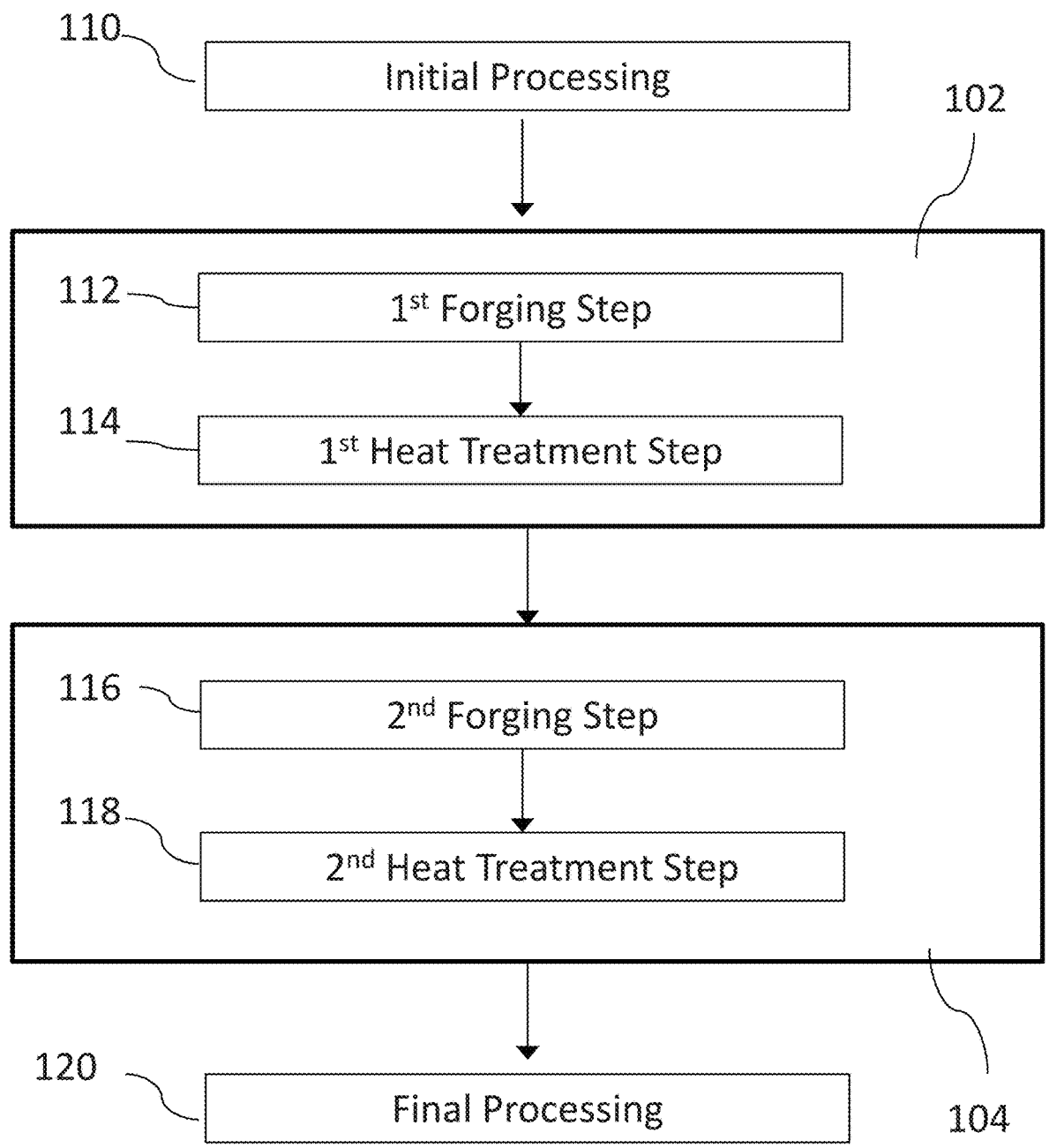
FIG. 3 is a block flow diagram of a method of forming a copper manganese alloy, according to some embodiments.

A method 100 of forming a copper manganese alloy is shown in FIG. 3. The method 100 includes forming a starting material in an initial processing step 110. For example, a copper material may be cast into a billet form using various casting techniques in combination with slow cooling, as described above. The copper material may include additives, such as other elements, which alloy with the copper to form a copper alloy. For example, the copper material may include copper as a primary component and one or more elements as a secondary component. In one example, the copper material may include manganese as a secondary component. In some embodiments, the copper manganese material may be formed using standard casting practices for a copper alloy including both copper and manganese.

After initial processing, the copper manganese alloy is subjected to a first processing step 102. In some embodiments, the first processing step 102 includes a first forging step 112 and a first heat treatment step 114. In various embodiments, the first forging step 112 may include reducing the height of the copper manganese billet by from about 10% to about 33%. For example, the first forging step 112 may include from a 10% reduction to a 25% reduction, from a 12% reduction to a 25% reduction, from about a 15% reduction to a 25% reduction, or from a 17% reduction to a 25% reduction in height of the copper manganese billet. In some embodiments, the first forging step 112 is unidirectional forging or uniaxial forging such that the billet is forged along one plane or axis. In some embodiments, the grain structure may be refined by a factor of at least about 10 during the first forging step 112 such that the total existing number of grains in the copper manganese billet increases by a factor of at least about 10 as a result of the first forging step 112. For example, after forging, the total number of grains in the copper manganese billet is increased by at least a factor of 10, as compared to the total number of grains in the copper manganese billet prior to forging. In another example, a material having a total of about 10 grains before the first forging step 112 will have a total of at least about 100 grains after the first forging step 112.

After the first forging step 112, the copper manganese alloy is subjected to the first heat treatment step 114. The first heat treatment step 114 may include heating the copper manganese billet at a temperature from about 650° C. to about 750° C., from about 675° C. to about 750° C., or from about 675° C. to about 700° C. for a period from about 0.5 hour to about 3 hours or for a period of about 1.5 to about 2 hours. For example, in one embodiment, the copper manganese billet may be heated at a temperature of about 700° C. for a period of about 2 hours. In some embodiments, the first heat treatment step 114 may be carried out for a sufficient time to reach temperature homogeneity and equilibrium within the billet. In other embodiments, the first heat treatment step 114 may be carried out at a sufficient temperature and time such that the grains do not regrow. In yet other embodiments, the first heat treatment step 114 may be carried out at a temperature and time sufficient to obtain from about 80% to 100% recrystallization of the existing grain structure, from about 90% to 100% recrystallization of the existing grain structure, or full recrystallization of the existing grain structure. In some examples, the grain structure may be refined by a factor of at least about 10 such that the total existing number of grains in the copper manganese billet increases by a factor of at least about 10, as described above, as a result of the first heat treatment step 114. For example, a copper manganese billet having a total of about 100 grains in a given cross-section before the first heat treatment step 114 will have a total of at least about 1,000 grains after the first heat treatment step. In other embodiments, the grain structure may be refined by a factor of at least about 50, at least about 100, at least about 1,000, at least about 10,000, at least about 100,000, or greater than 100,000.

After the first heat treatment step 114, the copper manganese alloy may be subjected to a second processing step 104 including a second forging step 116 and a second heat treatment step 118. In some embodiments, the second forging step 116 may include reducing the height of the billet to a final desired height. The final desired height of the billet will vary depending on a variety of factors. In some embodiments, the second forging step 116 may reduce the height of the billet from about 40% to about 80% or from about 50% to about 70% as desired. In some embodiments, the copper manganese billet is substantially equiaxed in shape after the second forging step 116. For example, the billet may be more equiaxed in shape after the second forging step 116 than after the first forging step 112. In some embodiments, the second forging step 116 is unidirectional forging or uniaxial forging such that the billet is forged along one plane or axis.

After the second forging step 116, the copper manganese billet may be subjected to a second heat treatment step 118. In some embodiments, the copper manganese billet may be heated to a temperature that is lower than the temperature of the first heat treatment step 114. For example, the copper manganese billet may be heated to a temperature from about 500° C. to about 650° C., from about 550° C. to about 650° C. or from about 600° C. to about 650° C. for a period from about 4 hours to about 8 hours to form a copper manganese alloy. In some embodiments, the copper manganese alloy may have a substantially refined grain structure after the second heat treatment step 118. For example, the copper alloy may have an average grain size of less than about 150 µm, less than about 100 µm, less than about 80 µm, less than about 50 µm, less than about 25 µm, or less than about 1 µm in diameter after the second heat treatment step 118.

After the second heat treatment step 118, the copper alloy may undergo further processing, as desired, in a final processing step 120. In some embodiments, the copper manganese billet may be subjected to additional processing steps, as described above. In other embodiments, the copper manganese billet may be subjected to a variety of conventional processing techniques such as optional additional forging, rolling, and/or severe plastic deformation such as equal channel angular extrusion (ECAE) to further refine the microstructure as desired. In yet other embodiments, the copper alloy may be formed into a sputtering target for use in various sputtering applications.

Various embodiments and examples of the present disclosure describe methods for forming a copper manganese alloy having a refined shape and/or a refined, uniform microstructure. Generally, an alloy billet must have a certain, minimum number of grains in relation to the size of the alloy billet (i.e., a substantially refined microstructure) to deform in a uniform manner when undergoing forging, rolling, ECAE, and/or other processing techniques. Therefore, advantages of the disclosed alloys include, for example, uniform deformation of the alloy billet during processing. In certain examples where further processing such as additional forging, rolling, and/or ECAE is desired, the present methods may facilitate less cracking and/or other surface defects in the resulting alloy product.

EXAMPLES

The following non-limiting examples illustrate various features and characteristics of the present invention, which is not to be construed as limited thereto.

The following experiments were conducted to evaluate the effects of various amounts of forging reduction and heat treatment temperatures on the shape and grain structure of a copper manganese alloy billet. The material used in all following experiments was a 6N copper manganese (CuMn) alloy having copper as a primary component and manganese as a secondary component at a concentration of 0.69 wt. %. The initial, as-cast grain size averaged several centimeters in diameter and grains were non-uniform throughout.

The first forging process included a unidirectional, two-step hot-forging process that involved heating the copper manganese billet in an oven for a time sufficient to reach temperature homogeneity and equilibrium. In most examples, this comprised an average temperature of about 550° C. for a period of about 1.5 hours to 2 hours. After heating, the copper manganese billet was forged to the desired percent reduction, as discussed in the examples below.

The first heat treatment process involved heating the copper manganese billet to a temperature sufficient to induce recrystallization. In most examples, this involved heating the billet to an average temperature of about 700° C. for a period of about 2 hours. However, these parameters are not meant to be limiting.

Example 1: Effect of Conventional Processing Methods on Copper Manganese Billet The effect of conventional processing methods (e.g., single-step forge) on the shape and grain structure of a copper manganese billet was observed. In a first heat treatment, the billet was heated to a temperature of about 550° C. for a period of about 2 hours. The billet was then subjected to a single forging step with a total of about 70% reduction in height. In a second heat treatment, the billet was then heated to various selected temperatures for a period of about 1.5 hours, as described below.

Figure 4A:
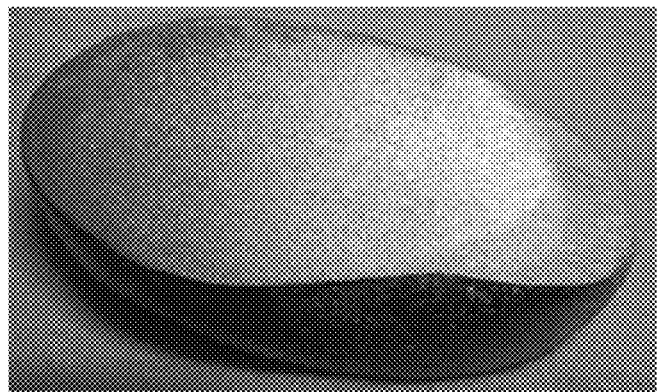
FIGS. 4A-C are photographs showing the effect of conventional processing methods on a copper manganese alloy.
Figure 4B:
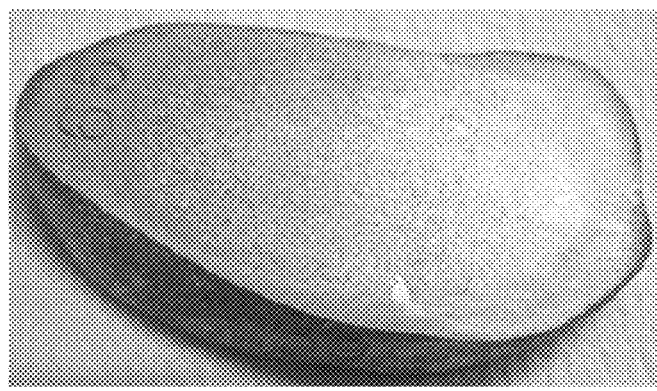
Figure 4C:
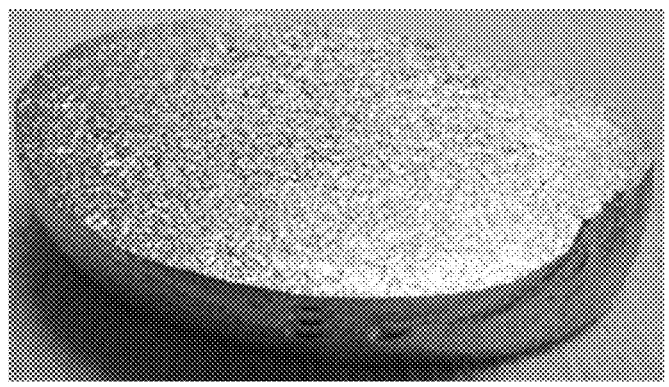

Results of the single-step forge are shown in FIGS. 4A-C. FIG. 4A shows a copper manganese billet that was heated to a temperature of about 550° C. during the second heat treatment step. FIG. 4B shows a copper manganese billet that was heated to a temperature of about 650° C. during the second heat treatment step. FIG. 4C shows a copper manganese billet that was heated to a temperature of about 800° C. during the second heat treatment step. As shown, in all three examples, the billet was substantially oblong and non-uniform in shape. Therefore, it was determined that a single-step forge is not adequate to produce a substantially equiaxed billet and that increasing the temperature of the second heat treatment does not cure this deficiency.

Example 2: Effect of Two-Step Forge with 25% Reduction

The effect of a two-step forge with 25% reduction for the first forging step on shape and grain structure of a copper manganese billet was observed. The first forging step was followed by a first heat treatment step in which the billet was heated to a temperature of 700° C. for a period of two hours. The billet was then forged to a final desired thickness (70% reduction) in a second forging step. No second heat treatment step was applied.

Figure 5:
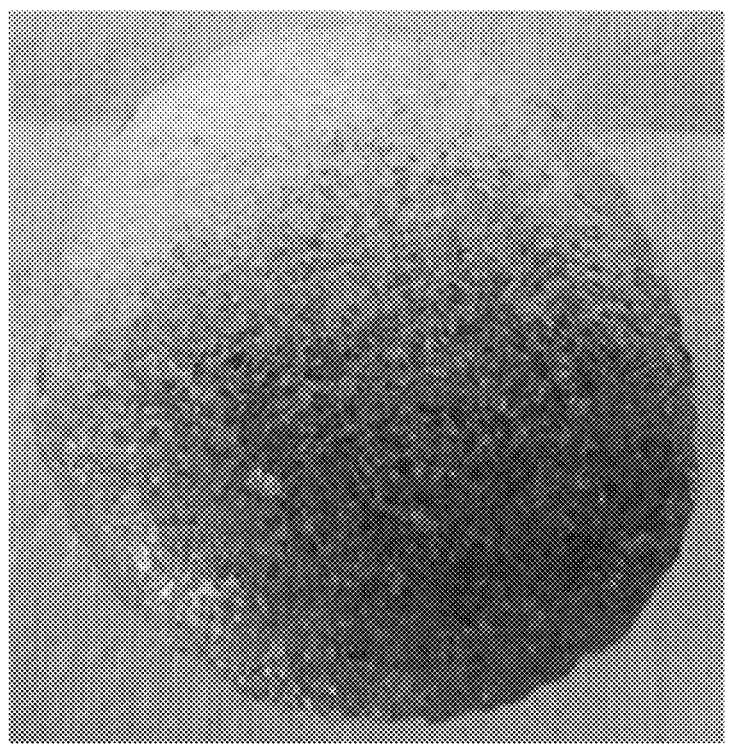
FIG. 5 is a photograph showing the effect of two-step forging process, according to some embodiments.

As shown in FIG. 5, the billet of Example 2 was substantially equiaxed in shape, as compared to the billets of Example 1, which were processed with a single-step forge. The billet of Example 2 also had a fine, recrystallized microstructure after the second forging step.

Example 3: Effect of Additional Heat Treatment

The effect of an additional heat treatment step after the second forging step on shape and grain structure of a copper manganese billet was observed. The copper manganese billet was subjected to the process of Example 2. The first forging step involved a 25% reduction and was followed by a first heat treatment step in which the billet was heated to a temperature of 700° C. for a period of two hours. The billet was then subjected to a second forging step in which the billet was reduced to a final, desired thickness (70% reduction). After the second forging step, the billet was then subjected to a second heating step as shown below in Table 1.

TABLE 1

| Experiment | Second Heat Treatment Temperature (° C.) | Second Heat Treatment Duration (hr) |
|---|---|---|
| A | 550 | 2 |
| B | 600 | 2 |

Figure 6A:
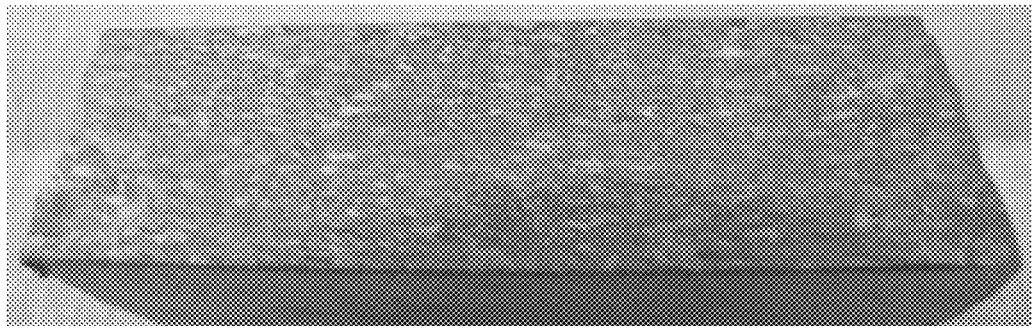
FIGS. 6A-C are photographs showing the effect of an additional heat treatment step after a 25% forging process, according to some embodiments.
Figure 6B:
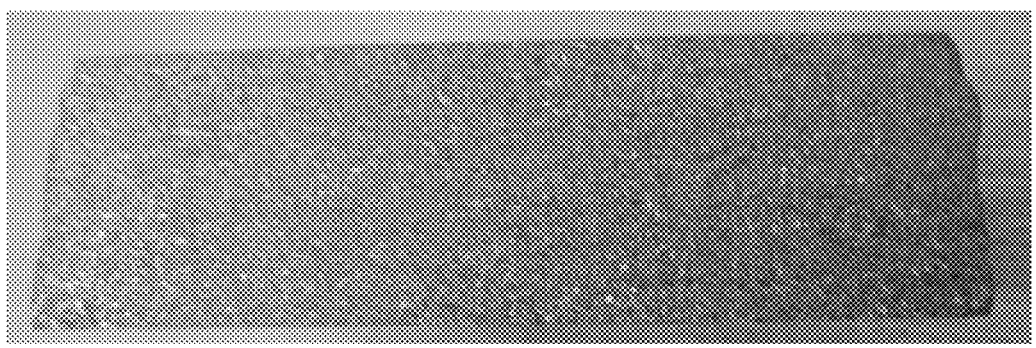
Figure 6C:
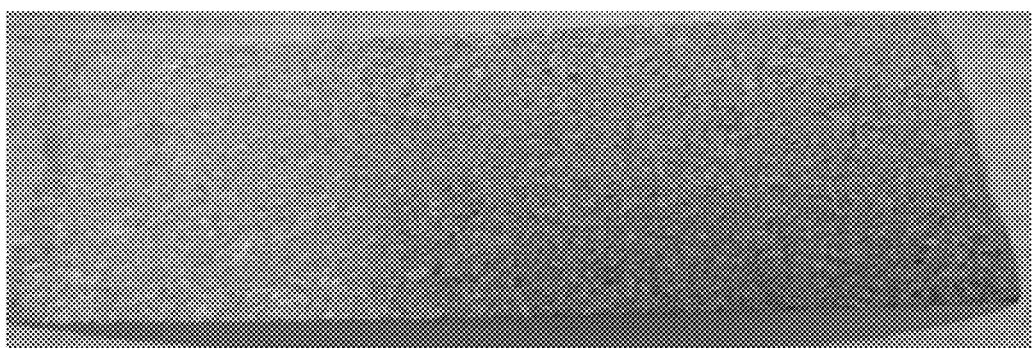

Results of the Example 3 are shown in FIGS. 6A-C. FIG. 6A shows the grain structure of the as-received copper manganese billet after the second forging step and before the second heat treatment step. FIG. 6B shows the grain structure of the copper manganese billet of Experiment A after the second heat treatment step. As shown, the grain structure is more refined than the grain structure of the as-received billet of FIG. 6A. FIG. 6C shows the grain structure of the copper manganese billet of Experiment B after the second heat treatment step. As shown, the grain structure is more refined than the grain structure of both the as-received billet and the billet of FIG. 6B. Therefore, it was determined that an additional heat treatment step after the second forging step produces an increasingly refined microstructure.

Example 4: Effect of Two-Step Forge with 17% Reduction

The effect of a two-step forge with 17% reduction for the first forging step on shape and grain structure of a copper manganese billet was observed. The first forging step was followed by a heat treatment step in which the billet was heated to a temperature of 700° C. for a period of two hours. The billet was then forged to a final desired thickness (70% reduction) in a second forging step.

The billet of Example 4 was substantially equiaxed in shape, as compared to the billets of Example 1, which were processed with a single-step forge. The billet of Example 4 also had a fine, recrystallized microstructure after the second forging step.

Example 5: Effect of Additional Heat Treatment

The effect of an additional heat treatment step after the second forging step on shape and grain structure of a copper manganese billet was observed. The copper manganese billet was subjected to the process of Example 4. The billet was subjected to a first forging step in which a two-step forge with 17% reduction was used. The first forging step was followed by a first heat treatment step in which the billet was heated to a temperature of 700° C. for a period of two hours. The billet was then subjected to a second, final forging step in which the billet was reduced to a final, desired thickness (70% reduction). After the second forging step, the billet was heated to various selected temperatures as shown below in Table 2.

TABLE 2

| Experiment | Second Heat Treatment Temperature (° C.) | Second Heat Treatment Duration (hr) |
|---|---|---|
| A | 550 | 2 |
| B | 600 | 2 |

Figure 7A:
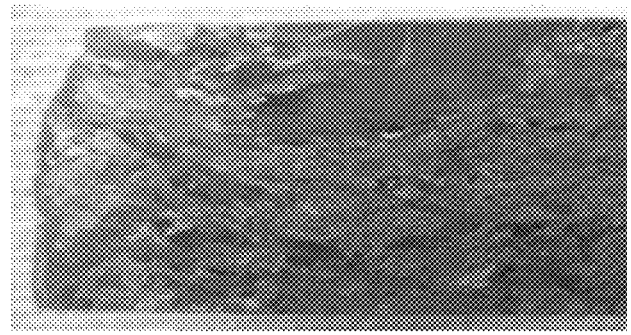
FIGS. 7A-C are photographs showing the effect of an additional heat treatment step after a 17% forging process, according to some embodiments.
Figure 7B:
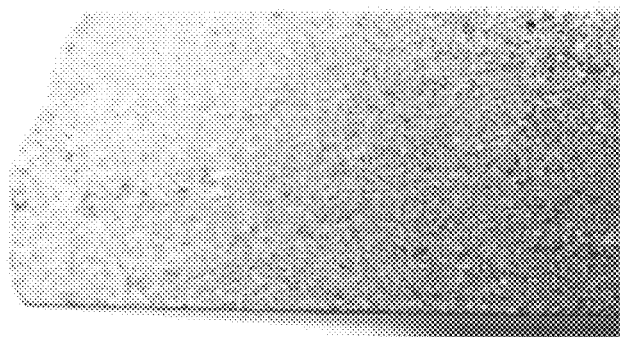
Figure 7C:
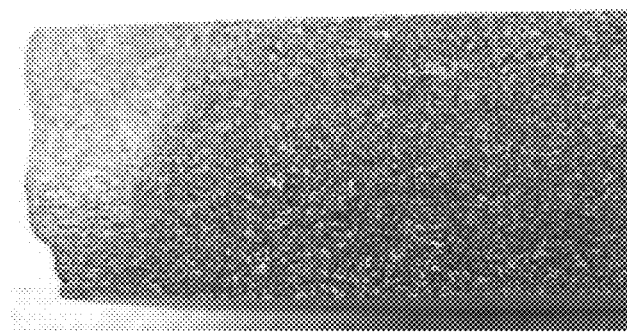

Results of the Example 5 are shown in FIGS. 7A-7C. FIG. 7A shows the grain structure of the as-received copper manganese billet after the second forging step and before the second heat treatment step. FIG. 7B shows the grain structure of the copper manganese billet of Experiment A after the second heat treatment step. As shown, the grain structure is more refined than the grain structure of the as-received billet of FIG. 7A. FIG. 7C shows the grain structure of the copper manganese billet of Experiment B after the second heat treatment step. As shown, the grain structure is more refined than the grain structure of the as-received billet of FIG. 7A.

Therefore, it was determined that an additional heat treatment step after the second forging step produces an increasingly refined microstructure.

Example 6: Effect of Two-Step Forge with 12% Reduction

The effect of a two-step forge with 12% reduction for the first forging step on shape and grain structure of a copper manganese billet was observed. The first forging step was followed by a heat treatment step in which the billet was heated to a temperature of 700° C. for a period of two hours. The billet was then forged to a final desired thickness (70% reduction) in a second forging step.

The billet of Example 6 was substantially equiaxed in shape, as compared to the billets of Example 1, which were processed with a single-step forge. The billet of Example 6 also had a fine, recrystallized microstructure after the second forging step.

Example 7: Effect of Additional Heat Treatment

The effect of an additional heat treatment step after the second forging step on shape and grain structure of a copper manganese billet was observed. The copper manganese billet was subjected to the process of Example 6. The billet was subjected to a first forging step in which a two-step forge with 12% reduction was used. The first forging step was followed by a first heat treatment step in which the billet was heated to a temperature of 700° C. for a period of two hours. The billet was then subjected to a second, final forging step in which the billet was reduced to a final, desired thickness (70% reduction). After the second forging step, the billet was then heated to various selected temperatures as shown below in Table 3.

TABLE 3

| Experiment | Second Heat Treatment Temperature (° C.) | Second Heat Treatment Duration (hr) |
| --- | --- | --- |
| A | 550 | 2 |
| B | 600 | 2 |
| C | 650 | 2 |

Figure 8A:
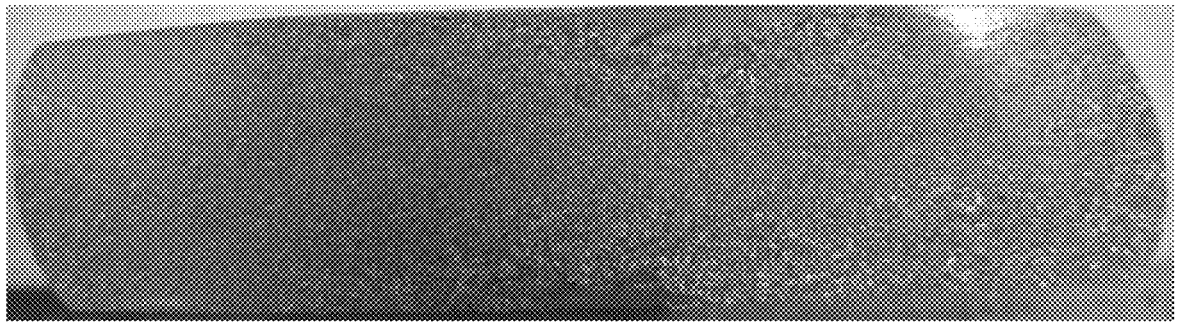
FIGS. 8A-C are photographs showing the effect of an additional heat treatment step after a 12% forging process, according to some embodiments.
Figure 8B:
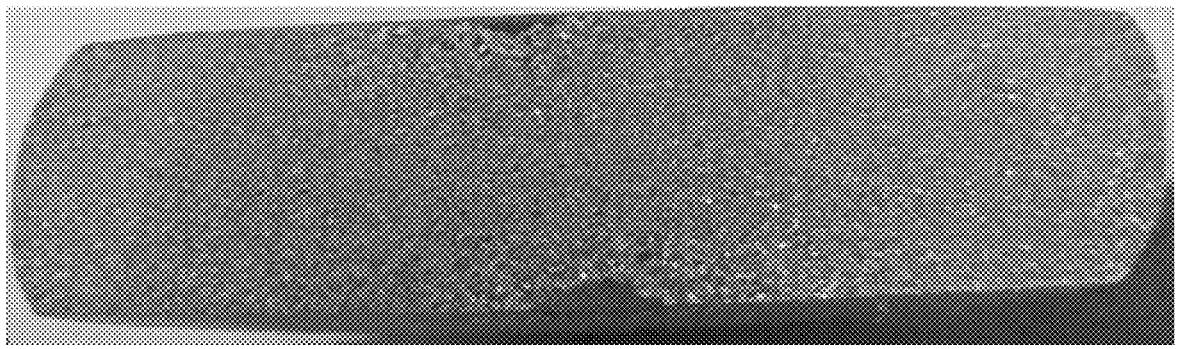
Figure 8C:
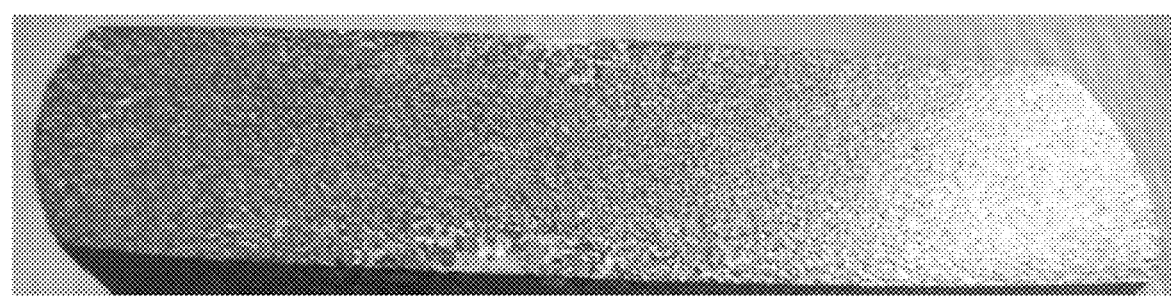

Results of Example 7 are shown in FIGS. 8A-8C. FIG. 8A shows the grain structure of the copper manganese billet of Experiment A after the second heat treatment step. As shown, the grain structure is refined except for portions at the top center and bottom center of the billet. FIG. 8B shows the grain structure of the copper manganese billet of Experiment B after the second heat treatment step. As shown, the grain structure is more refined than the grain structure of the billet of FIG. 8A. The billet did contain unrefined portions (e.g., large grains) at the top center and bottom center of the billet. FIG. 8C shows the grain structure of the copper manganese billet of Experiment C after the second heat treatment step. The grain structure is more refined than the grain structure of both billets of Experiments A and B.

Figure 9:
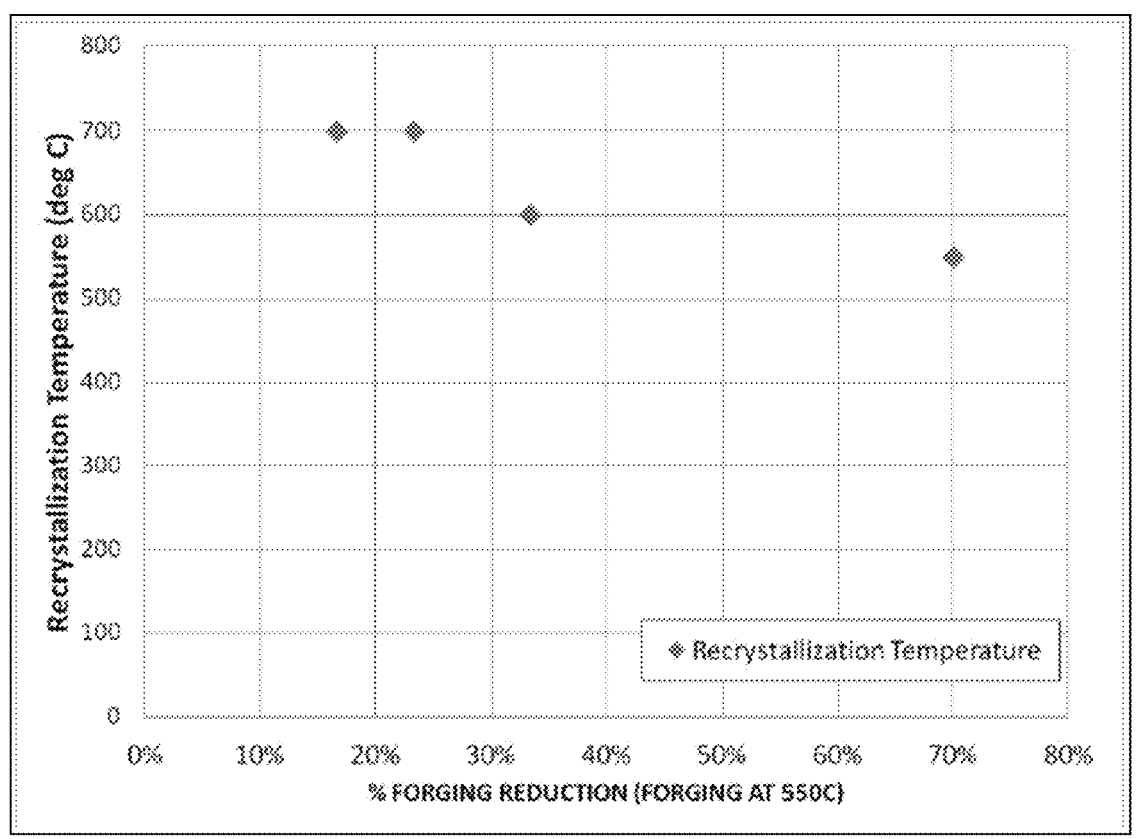
FIG. 9 is a graph illustrating a relationship between the heat treatment temperature and percent forging/reduction in the first forging step, according to some embodiments.

This example illustrates the apparent interplay between the heat treatment temperature and percent forging/reduction in the first forging step. That is, a higher heat treatment temperature is required for billets subjected to less percent reduction during the first forging step in order to achieve a similar grain structure. This relationship is shown in FIG. 9. For example, a billet undergoing only 17% reduction during the first forging step required a recrystallization (i.e., heat treatment temperature) of about 700° C. during the second heat treatment step, while billets subjected to higher percent reductions required lower heat treatment temperatures in order to achieve similar grain structures.

Example 8: Effect of Two-Step Forge on Large-Scale Billets

Two large-scale (10-inch by 10-inch) billets were subjected to the following process. One billet, referred to as Sample 1, was a 6N copper manganese alloy having 0.69 wt. % manganese, while the other billet, referred to as Sample 2, was a copper manganese alloy having 0.43 wt. % manganese. Both as-cast billets were first subjected to a first forging step with 25% reduction. The billets were then heated to a temperature of about 700° C. for a period of about two hours. The billets were then subjected to a second forging step with 70% reduction. The billets were then heated to a temperature of about 600° C. for a period of about four hours.

TABLE 4

| | R Ratio | | Average Grain Size (μm) | |
| --- | --- | --- | --- | --- |
| Process Step | Sample 1 | Sample 2 | Sample 1 | Sample 2 |
| Initial (As-Cast) | 35 | 46 | 48,446 | 42,258 |
| 1st Forge Step + 700° C., 2 h | 4,786,827 | 5,610,733 | 131 | 121 |
| 2nd Forge Step + 600° C., 2 h | 14,603,866 | 22,076,524 | 75 | 61 |

Figure 10A:
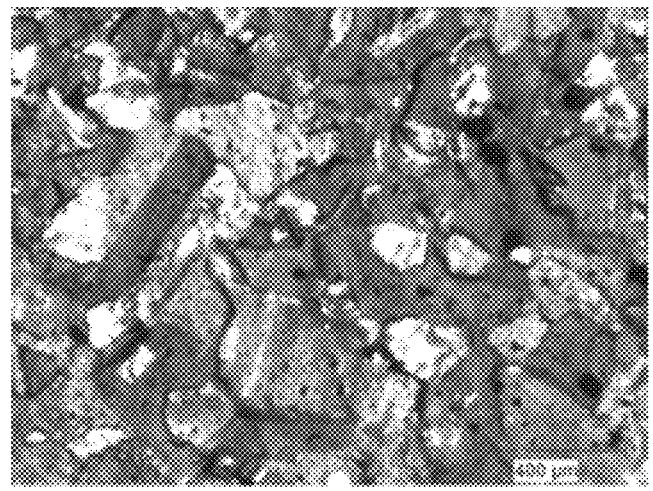
FIGS. 10A-B are micrographs of grain structures of various large-scale copper manganese alloy billets, according to some embodiments.
Figure 10B:
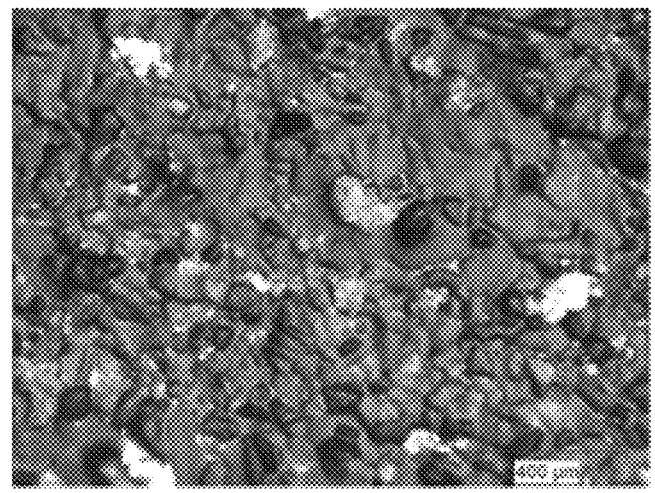

Both Samples 1 and 2 had a substantially equiaxed shape and a fine, recrystallized microstructure. As shown in Table 4 and FIGS. 10A, 10B, and 10D, the average grain structure of Sample 1 was less than 150 μm (about 121 μm) after the first two-step forge with 25% reduction and subsequent heat treatment step. The average grain structure was less than 80 μm (about 61 μm) after the second two-step forge and subsequent heat treatment step. As shown in Table 4 and FIG. 10D, similar data were obtained for Sample 2.

Figure 10C:
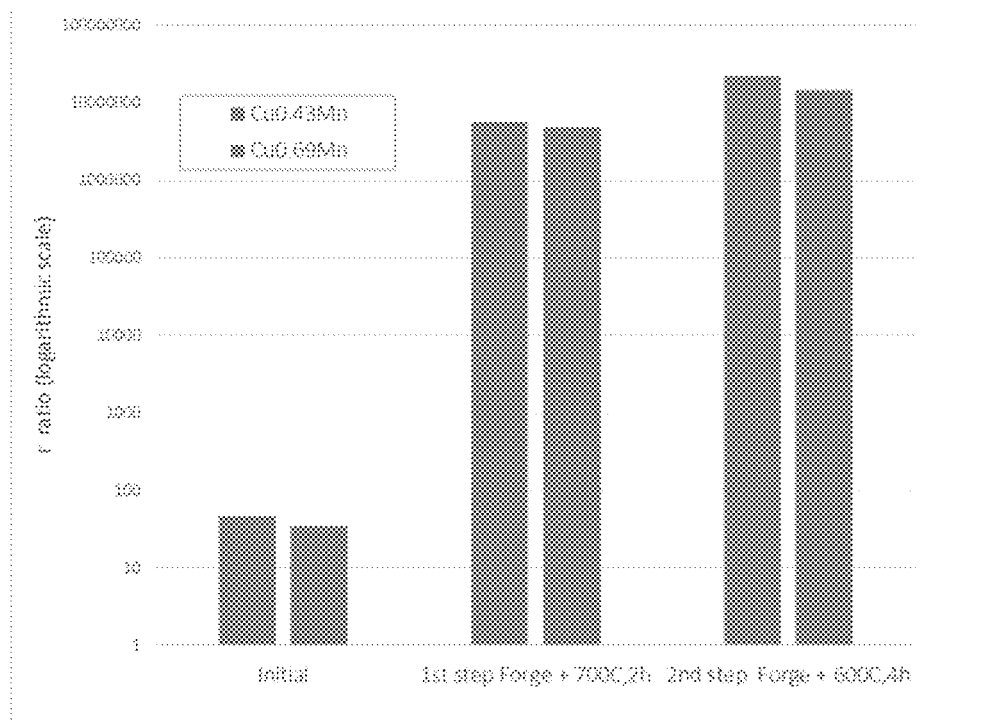
FIGS. 10C-D are graphs illustrating an R ratio and grain size, respectively, for the copper manganese alloys of FIGS. 10A-B, according to some embodiments.
Figure 10D:
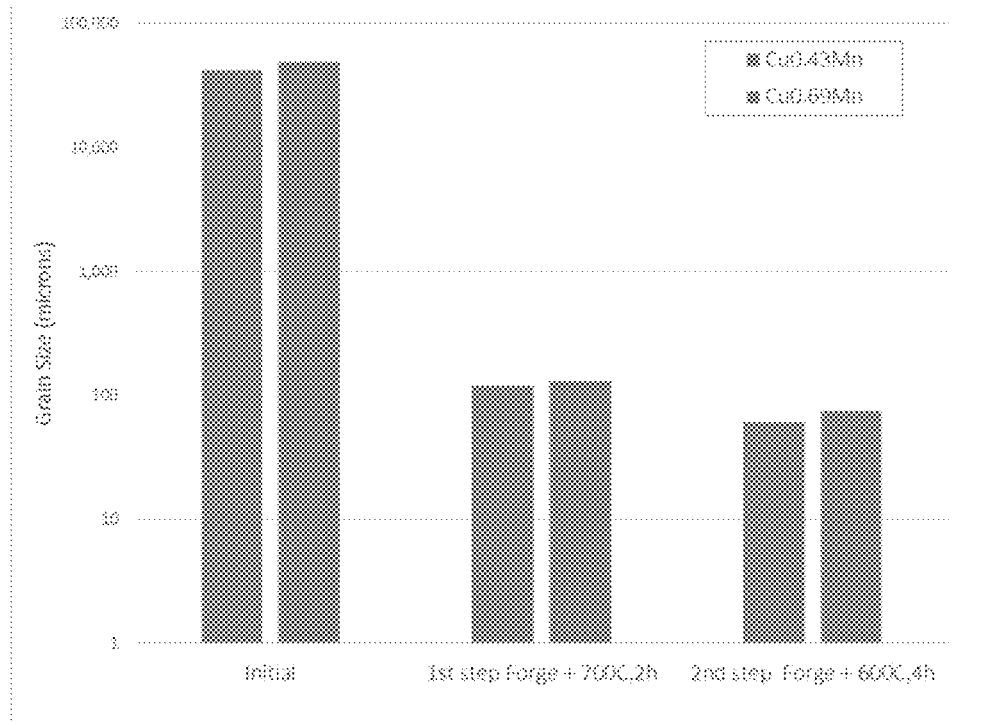

FIG. 10C shows the ratio R and grain size after both the first two-step forge and subsequent heat treatment step and the second two-step forge and subsequent heat treatment step. For example, the ratio R of Sample 1 increased from about 35 to greater than four million after the first two-step forge and subsequent heat treatment step, and to greater than 14 million after the second two-step forge and subsequent heat treatment step. Similar data were obtained for Sample 2, as shown in Table 4 and FIG. 10C.

Example 9: Effect of Additional Deformation in Large Scale Billets

The two large-scale billets of Example 8 were further processed with ECAE after the second two-step forge and subsequent heat treatment step described in Example 8. The billets were subjected to four ECAE passes (e.g., a total deformation of over 99.9% in equivalent percent reduction) in order to achieve microstructural refinement in grain size and texture. The average grain size of Sample 1 is shown below in Table 5.

TABLE 5

| Location | Grain Size (μm) | Average Grain Size (μm) |
| --- | --- | --- |
| Center | 0.404 | 0.379 |
| Edge | 0.354 | |

Figure 11A:
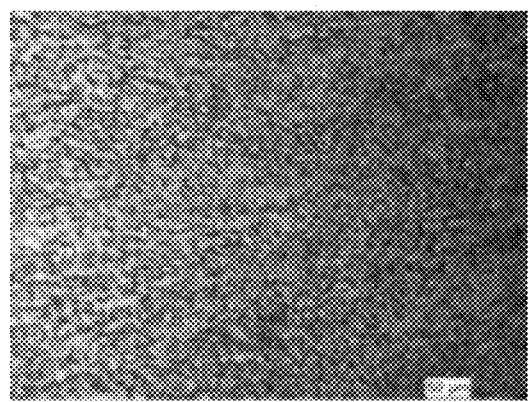
FIGS. 11A-B are micrographs of the copper manganese alloys of FIGS. 10A-B after additional ECAE processing, according to some embodiments.
Figure 11B:
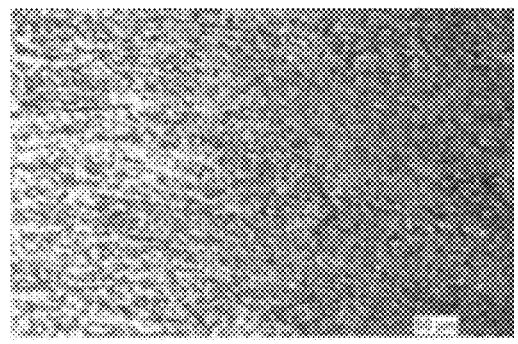

No detrimental cracking of the billets was observed during the ECAE process and a fine and uniform microstructure was obtained. As shown in FIGS. 11A and 11B, the average grain structure of Sample 1 was less than 1 micron after the ECAE process. FIG. 11A shows the grain structure at the center of the top face of the billet. FIG. 11B shows the grain structure at an edge of the top face of the billet. Sample 2 had a microstructure similar to that shown above in Table 5.

Example 10: Effect of Two-Step Forge on Small-Scale Billets

Two, small-scale billets, referenced as Sample 1 and Sample 2, having a height of about 1 inch and a diameter of about 1.5 inches were subjected to the following process. Both billets were a 6N copper manganese alloy having 0.69 wt. % manganese. Sample 1 and Sample 2 had an initial, as-cast grain size of about 18,500 µm and 16,000 µm, respectively.

Sample 1 was subjected to a first forging step with 12% reduction. Sample 2 was subjected to a first forging step with 25% reduction. Both billets were then heated to a temperature of about 700° C. for a period of about two hours. Both billets were then subjected to a second forging step with 70% reduction and were heated to a temperature of about 600° C. for a period of about four hours. Results are shown in Table 6 below.

TABLE 6

| Process Step | R Ratio | | Average Grain Size (µm) | |
|---|---|---|---|---|
| | Sample 1 | Sample 2 | Sample 1 | Sample 2 |
| Initial (As-Cast) | 3 | 4 | 18,500 | 16,000 |
| 1$^{st}$ Forge Step + 700° C., 2 h | 65,717 | 100,660 | 125 | 101 |
| 2$^{nd}$ Forge Step + 600° C., h | 215,616 | 285,232 | 69 | 60 |

Both billets had a substantially equiaxed shape and a fine, recrystallized microstructure. As shown in Table 6 and FIG. 12B, the average grain structure of Sample 2 was less than 150 µm (about 101 µm) after the first 25% forging step and subsequent heat treatment step. The average grain structure of Sample 2 was less than 80 µm (about 60 µm) after the second forging step and subsequent heat treatment step. As shown, similar data were obtained for Sample 1.

Figure 12A:
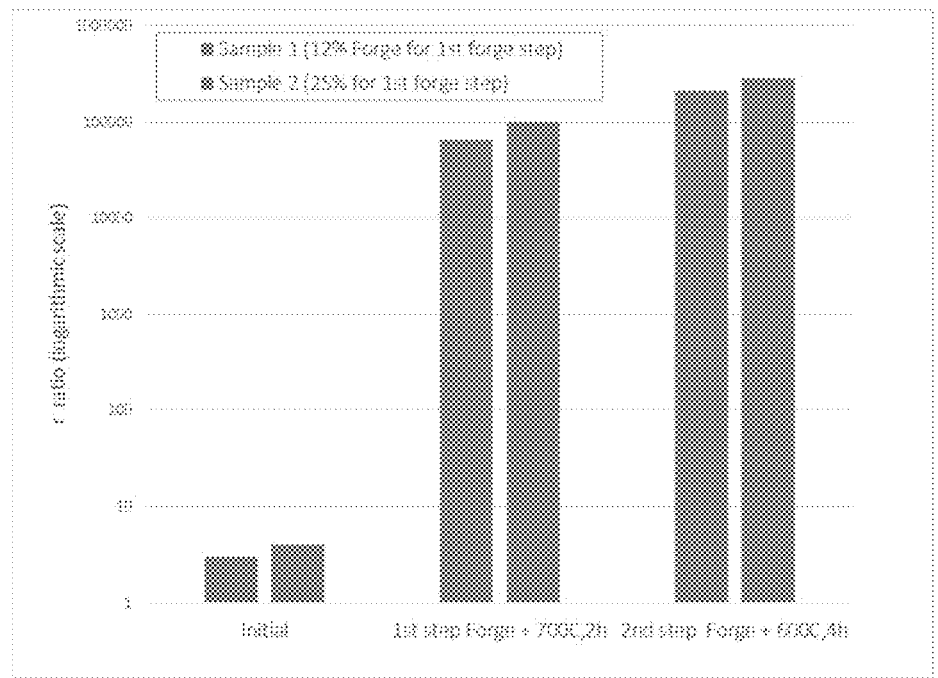
FIG. 12A is a graph of the R ratio for copper manganese alloy billets, according to some embodiments.
Figure 12B:
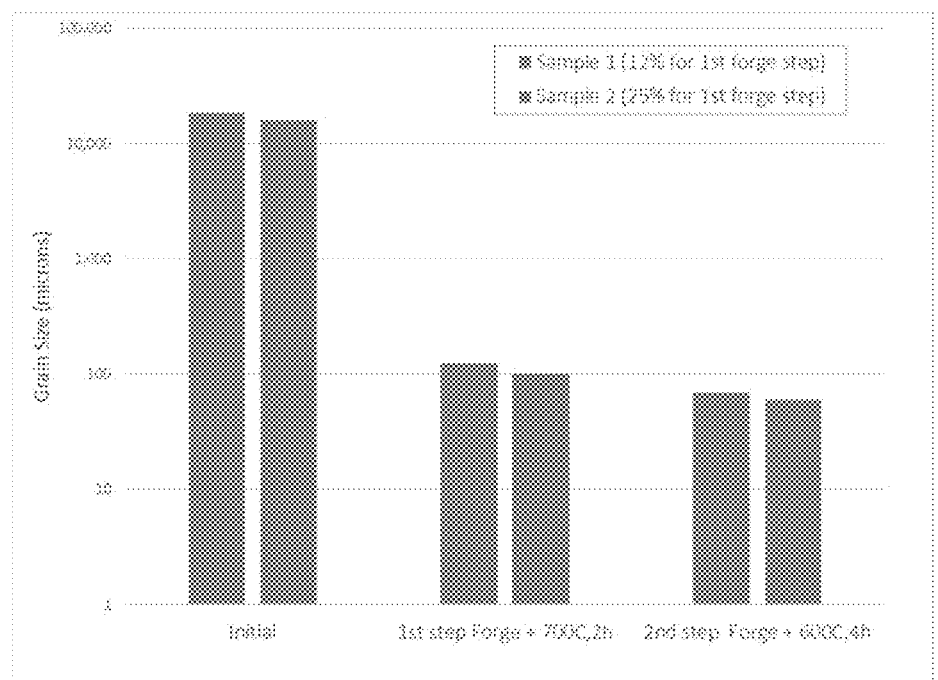
FIG. 12B is a graph of the grain size for copper manganese alloy billets, according to some embodiments.

Table 6 and FIG. 12A show an increase in the R ratio after the first forging and heat treatment steps and the second forging and heat treatment steps for both samples. For example, the R ratio of Sample 2 increased from 4 to about 100,660 after the first forging step and subsequent heat treatment step. The R ratio of Sample 2 then increased to about 285,232 after the second forging step and subsequent heat treatment step. As shown, similar data were obtained for Sample 1.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above described features.

The following is claimed:

1. A method of forming a copper manganese sputtering target, the method comprising:
    subjecting a copper manganese billet to a first unidirectional forging step such that, after forging, a total number of grains in the copper manganese billet is increased by at least a factor of 10, as compared to the total number of grains in the copper manganese billet prior to forging;
    heating the copper manganese billet at a temperature from about 650° C. to about 750° C. for from about 1 hour to about 3 hours in a first heat treatment step;
    subjecting the copper manganese billet to a second unidirectional forging step such that the height of the copper manganese billet is reduced by from about 40 percent to 95 percent; and
    heating the copper manganese billet at a temperature from about 500° C. to about 650° C. for from about 4 hours to about 8 hours in a second heat treatment step.

2. The method of claim 1, wherein manganese in the copper manganese billet is present at a weight percentage of at least about 0.010 wt. %.

3. The method of claim 1, wherein the height of the copper manganese billet is reduced by from about 10 percent to about 33 percent during the first unidirectional forging step.

4. The method of claim 1, wherein the height of the copper manganese billet is reduced by from about 15 percent to about 25 percent during the first unidirectional forging step.

5. The method of claim 1, wherein the copper manganese billet is heated to a temperature from about 675° C. to about 700° C. for from about 1.5 hours to 2 hours during the first heat treatment step.

6. The method of claim 1, wherein the total number of grains in the copper manganese billet is increased by a factor of at least 100 during the first heat treatment step.

7. The method of claim 1, wherein the height of the copper manganese billet is reduced by from about 50 percent to about 70 percent during the second unidirectional forging step.

8. The method of claim 1, wherein the shape of the copper manganese billet is substantially equiaxed after the second unidirectional forging step.

9. The method of claim 1, wherein the copper manganese billet is heated to a temperature from about 550° C. to about 600° C. during the second heat treatment step.

10. The method of claim 1, further comprising casting the copper manganese billet by subjecting a copper material to slow cooling.

11. The method of claim 1, wherein the copper manganese billet has an average grain size of less than about 150 µm.

12. The method of claim 1, wherein the copper manganese billet has an average grain size of less than about 80 µm.

13. A method of forming a copper alloy sputtering target, the method comprising:
    subjecting a copper alloy billet to a first unidirectional forging step such that, after forging, a total number of grains in the copper alloy billet is increased by at least a factor of 10, as compared to the total number of grains in the copper alloy billet prior to forging;
    heating the copper alloy billet after the first unidirectional forging step in a first heat treatment step at a temperature and for a time sufficient to achieve 100 percent recrystallization of the copper alloy billet;
    subjecting the copper alloy billet to a second unidirectional forging step such that a height of the copper alloy billet is reduced by from about 40 percent to 95 percent;
    heating the copper alloy billet after the second unidirectional forging step in a second heat treatment step at a temperature and for a time sufficient to achieve a substantially refined grain structure; and
    forming the copper alloy billet into a copper alloy sputtering target.

14. The method of claim 13, wherein the copper alloy billet includes copper as a primary component and manganese as a secondary component.

15. The method of claim 13, wherein the first heat treatment step is conducted at a temperature and time such that the grains do not regrow.

16. The method of claim 13, wherein the first heat treatment step is conducted at a temperature from about 650° C. to about 750° C. for from about 1 hour to about 3 hours.

17. The method of claim 13, wherein the copper alloy billet has an R ratio of at least 500 after the second heat treatment step.

18. The method of claim 17, wherein the R ratio is from about 100,000 to 100,000,000.

19. The method of claim 13, further comprising processing the copper alloy billet with equal channel angular extrusion (ECAE) after the second heat treatment step.

* * * * *